US005517685A

United States Patent [19]
Aoyama et al.

[11] Patent Number: 5,517,685
[45] Date of Patent: May 14, 1996

[54] PLL CIRCUIT HAVING A MULTILOOP, AND FM RECEIVING METHOD AND APPARATUS ABLE TO UTILIZE THE SAME

[75] Inventors: Syuji Aoyama, Saitama; Takao Funahashi, Tokyo; Kiyoshi Kubo, Katano; Yasuhito Okawa, Otsu; Takeshi Sato, Hirakata; Hiroshi Takahashi, Neyagawa, all of Japan

[73] Assignee: Matsushita Electric Industrial Co., Ltd., Osaka, Japan

[21] Appl. No.: 227,125

[22] Filed: Apr. 13, 1994

[30] Foreign Application Priority Data

Apr. 27, 1993 [JP] Japan .................................. 5-100905
Apr. 27, 1993 [JP] Japan .................................. 5-100906

[51] Int. Cl.$^6$ .................. H04B 1/16; H03L 7/08; H03L 7/099
[52] U.S. Cl. .......................... 455/260; 455/264; 455/316; 331/11; 331/18
[58] Field of Search .................... 455/258–260, 455/264, 266, 207, 209, 314–316; 331/11, 17, 18, 1 A, 25

[56] References Cited

U.S. PATENT DOCUMENTS

| | | |
|---|---|---|
| 3,792,478 | 2/1974 | Parquier et al. . |
| 4,581,643 | 4/1986 | Carlson . |
| 4,661,995 | 4/1987 | Kashiwagi . |
| 4,888,564 | 12/1989 | Ishigaki . |
| 4,940,952 | 7/1990 | Kegasa . |
| 4,970,474 | 11/1990 | Kennedy et al. ............. 455/260 |
| 4,977,613 | 12/1990 | Holcomb, Sr. et al. ............. 455/260 |
| 5,119,043 | 6/1992 | Borwn et al. . |
| 5,157,341 | 10/1992 | Fobbester et al. ............. 331/18 |
| 5,181,115 | 1/1993 | Flamm et al. . |

FOREIGN PATENT DOCUMENTS

| | | |
|---|---|---|
| 0414392A2 | 2/1991 | European Pat. Off. . |
| 3192821 | 8/1991 | Japan . |
| 2122822 | 1/1984 | United Kingdom . |

OTHER PUBLICATIONS

Thorpe, "Designing a Communications Receiver", Electronics & Wireless World, vol. 93, No. 1614, Apr. 1987, Sutton, Surrey, Great Britain, pp. 409–413.
Gerzelka, "The Input Circuit of a KW Receiver for 2 . . . 30 MHz", Funk–Technik, vol. 31, No. 14, Jul. 1976, pp. 441, 444–446 and partial translation.

*Primary Examiner*—Chi H. Pham
*Attorney, Agent, or Firm*—Watson Cole Stevens Davis

[57] ABSTRACT

The PLL circuit provides both the advantages of analog phase control, in which a good C/N ratio can be realized, and the advantages of digital phase control, in which broad-band lock can be performed. A multi-channel FM receiving method and apparatus are able to utilize the PLL circuit to reduce the influence of the leakage occurring among input signals and suppress image disturbance. One PLL circuit includes: a VCO; a pre-scaler for dividing a feedback signal obtained from the VCO; a first distributor for distributing the feedback signal to send first and second digital feedback signals; a second distributor for distributing a reference signal to send a digital reference signal and an analog reference signal; a digital phase comparator for comparing the digital reference signal and the first digital feedback signal with each other to send a digital phase error signal; a charge pump; a mixer for adding the digital phase error signal to an analog phase error signal, which is obtained by comparing the analog reference signal with the second digital feedback signal to send a composite phase error signal; and a low-pass filter for eliminating high frequency components from the composite phase error signal to input the resultant signal to the VCO.

4 Claims, 11 Drawing Sheets

FIG. 10A
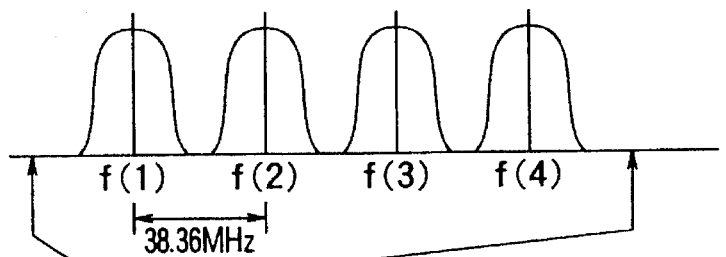
FIG. 10B
FIG. 10C
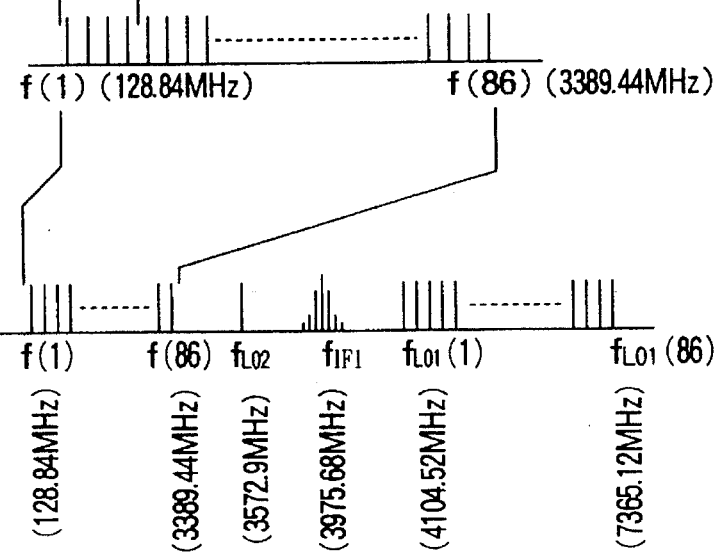

FIG. 11
PRIOR ART
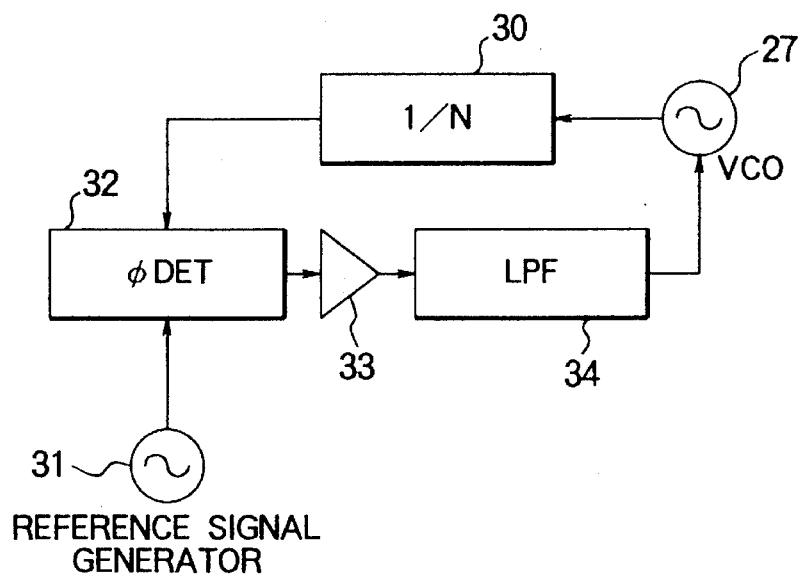
FIG. 12A
PRIOR ART
FIG. 12B
PRIOR ART
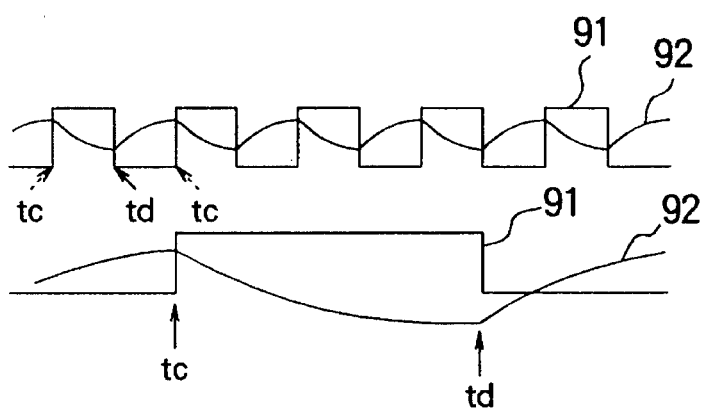

PLL CIRCUIT HAVING A MULTILOOP, AND FM RECEIVING METHOD AND APPARATUS ABLE TO UTILIZE THE SAME

BACKGROUND OF THE INVENTION

1. Field of the Invention

The present invention relates, in general, to a PLL (phase-locked loop) circuit which is used to improve the C/N ratio of a broad-band voltage controlled oscillator (hereinafter, referred to as "a VCO" for brevity, when applicable) which has high sensitivity, and more particularly to a PLL circuit which is utilized in a synthesizer for which an excellent spectrum is required, and multi-channel FM receiving method and apparatus which are capable of utilizing this PLL circuit and which are utilized as either a front-end device of a BS or CS tuner, or a receiving side front-end device used in CATV service and the like in a local area.

2. Description of the Related Art

Heretofore, in such a PLL circuit, for example, a digital phase comparator has been used and its phase detecting voltage is subjected to amplification and filtering through a charge pump circuit to be used as a control voltage for a VCO. FIG. 1 is a functional block diagram showing a configuration of a conventional digital PLL circuit. In FIG. 1, the reference numeral 1 designates a digital phase comparator which operates to compare two digital signals input thereto to output a signal representing a phase difference therebetween, and the reference numeral 2 designates a charge pump which operates to smooth the phase difference signal through an active type low-pass filter, thereby subjecting the pulse waveform to amplification and smoothing. The reference numeral 3 designates a VCO which receives a control voltage as a DC voltage to vary a frequency of an output oscillation signal. The output signal of the charge pump 2 is supplied as the control voltage to the VCO 3. The reference numeral 4 designates a pre-scaler which frequency-divides the output oscillation signal of the VCO 3 to obtain a feedback signal having a suitable frequency, and the reference numeral 5 designates a reference signal generator which generates a reference signal.

In the configuration shown in FIG. 1, the digital PLL circuit is designed in such a way that the phase error occurring between the reference signal and the feedback signal is detected by the digital phase comparator 1, and the DC control voltage corresponding to that phase error is input to the VCO 3 through the charge pump 2, thereby obtaining an output signal having a predetermined frequency.

On the other hand, FIG. 2 is a functional block diagram showing a configuration of a conventional analog PLL circuit. In FIG. 2, the reference numeral 11 designates a multiplier (a mixer) which multiplies two analog signals, which are different in phase from each other, thereby outputting a signal representing the phase difference between the two signals. The reference numeral 12 designates a passive type low-pass filter which eliminates the high frequency components. The reference numeral 13 designates a VCO which oscillates in accordance with a control voltage input thereto. The reference numeral 14 designates a pres-caler which receives a tuning voltage to divide the output signal of the VCO, thereby producing an analog feedback signal, and the reference numeral 15 designates a reference signal oscillator which generates a reference signal.

In the configuration shown in FIG. 2, the mixer 11 multiplies the analog reference signal which has been output from the reference signal generator 15 by the analog feedback signal which has been obtained by frequency-dividing in the pre-scaler 14 and then outputs a signal which includes a phase error signal corresponding to the phase difference therebetween, and a phase summing signal having a frequency two times as high as that of the input signal. Then, the output signal of the mixer 11 is supplied to the low-pass filter 12 in which both the phase summing signal and the remaining carrier component are eliminated, and as a result, the DC control voltage corresponding to the phase error is output from the low-pass filter 12. In addition, the control voltage is supplied to the VCO 13. Thus, the analog PLL circuit is constructed in this manner.

However, in the above-mentioned conventional PLL circuits, each of the digital phase-comparison type and the analog phase-comparison type had its merits and demerits from a viewpoint of the synthesizer control of the broad-band VCO having high sensitivity. As a result, it was impossible to fulfill both the aspects of the good C/N ratio improvement and the broad-band lock. That is, there arose the problem that a sufficient C/N ratio or noise suppression could not be obtained in the digital PLL circuit. On the other hand, in the analog PLL circuit, since the amplitude of the output voltage of the mixer acting as the phase comparator was small and also the sine-wave analog signal was input to the mixer, it was difficult to obtain the broad-band drawing state (the lock state).

Next, a description will hereinbelow be given with respect to conventional FM receiving method and apparatus utilizing the PLL circuit of this kind as described above.

Heretofore, the FM receiving method and apparatus of this kind have utilized the down-converting system. FIG. 3 is a functional block diagram showing a configuration of the conventional multi-channel FM receiver. In FIG. 3, the reference numeral 21 designates a high-pass filter which operates to select a multi-channel FM signal from an input signal, and the reference numeral 22 designates a gain variable control unit which adjusts the amplitude of the FM signal which has been obtained from the high-pass filter 21 to a predetermined level. In addition, the reference numeral 23 designates a variable band-pass filter which operates to select the FM signal of a desired channel in accordance with a channel selection command issued from a controller (not shown). The reference numeral 24 designates a broad-band amplifier which amplifies the selected FM signal. The reference numeral 25 designates a converting mixer which receives a local oscillation signal to down-convert the FM signal obtained from the amplifier 24 and to produce a signal having an intermediate frequency. Further, the reference numeral 26 designates a SAW (Surface Acoustic Wave) filter which eliminates the unnecessary components of the intermediate frequency signal obtained from the down-converting mixer 25.

The reference numeral 27 designates a VCO, an oscillation frequency of the output signal of which is changed in accordance with a DC control signal. The reference numeral 28 designates a distributor which receives the output signal supplied from the VCO 27 as an input signal to distribute the input signal into the local oscillation signal which is supplied to the mixer 25 and a feedback signal which is used to produce the DC control signal. The reference numeral 29 designates a pre-scaler which operates to frequency-divide the feedback signal supplied thereto by $1/128$. The reference numeral 30 designates a programmable pre-scaler which operates to further frequency-divide the feedback signal, which has been obtained by the frequency-dividing in the pre-scaler 29, by $1/N$ (N is a positive integral number and changes depending on a channel selection signal) in accordance with the channel selection command issued from the controller (in particular, not shown).

The reference numeral 31 designates a reference signal generator which generates a reference signal. The reference numeral 32 designates a phase error detecting circuit which detects a phase error occurring between the feedback signal obtained from the programmable pre-scaler 30 and the reference signal to produce a phase error signal. The reference numeral 33 designates an amplifier which amplifies the phase error signal, and the reference numeral 34 designates a low-pass filter which extracts the DC component from the phase error signal to supply the DC component as the DC control signal for the VCO 27. By adopting the configuration shown in FIG. 3, the receiving operation according to the single super receiving method can be performed.

Next, a description will hereinbelow be given with respect to the operation of the conventional multi-channel FM receiver. Now, it is assumed that the multi-channel FM signal, a frequency of which is in the range of about 950 MHz to 2,000 MHz according to the BS (Broadcasting Satellite) format, is received as the input signal. The multi-channel FM signal thus input is eliminated with the unnecessary low frequency components thereof through the high-pass filter 21, and then adjusted to the predetermined level by the gain variable control unit 22. Then, only the desired channel signal is selected by the variable frequency band-pass filter 23, thereby suppressing the image disturbance. Thereafter, the FM signal of the selected channel is amplified by the broad-band amplifier 24 and then is converted into the intermediate frequency signal having a frequency of 402.78 MHz by the down-converting mixer 25 to pass through the SAW filter 26. Then, the resultant signal is detected by a detector (in particular, not shown).

In addition, the local oscillation signal which is used in the down-converting operation is made oscillate at the frequencies of about 1,350 MHz to 2,400 MHz, and the oscillation signal is controlled by using the comparison frequency of about 10 kHz in the PLL synthesizer. That is, the loop circuit extending from the VCO 27 up to the low-pass filter 34 constitutes the PLL circuit 35 which is controlled by the controller (in particular, not shown).

However, in the above-mentioned conventional single super-receiving method, in the case where the number of channels increases, the variable frequency range of the variable frequency band-pass filter 23 becomes wide and thus it is difficult to put the variable frequency range band-pass filter 23 into practice. This is a problem. In addition, the oscillation frequency band of the VCO 28 requires necessarily the range exceeding one octave. In this case as well, it is impossible to prevent the circuit from being complicated. This is another problem. In addition, since the local oscillation signal is present in the frequency band of the input signal, in the case where a plurality of tuners are driven in parallel with one another, the leakage of the local oscillation signal hinders the operation of the adjacent tuners. This is still another problem.

SUMMARY OF THE INVENTION

The present invention was made in order to solve the above-mentioned problems associated with the prior art FM receiving method and apparatus, and therefore, it is an object of the present invention to provide a PLL circuit which has both the merits of the analog phase control, in which good C/N ratio improvement can be performed, and the merits of the digital phase control, in which broad-band lock can be performed, and to provide a multi-channel FM receiving method and apparatus which are capable of utilizing that PLL circuit and which are capable of reducing the influence of the leakage between a plurality of tuners and suppressing the image disturbance with a simple circuit configuration by performing the tuning using the double super method.

According to a first aspect of the present invention, a PLL circuit is provided which includes: a VCO for generating an output signal having a frequency which is variable in accordance with a control voltage; a pre-scaler for frequency-dividing the output signal supplied from the VCO to obtain a digital feedback signal; reference signal generating means for generating both an analog reference signal and a digital reference signal each having a reference frequency; digital phase error detecting means for comparing the digital reference signal with the digital feedback signal to obtain a digital phase error signal representing a phase error therebetween and for integrating the digital phase error signal; analog phase error detecting means for comparing the analog reference signal with the digital feedback signal to obtain an analog signal representing a phase error therebetween; adding means for adding the analog phase error signal to the integrated digital phase error signal to obtain a composite phase error signal; and a low-pass filter for eliminating the high frequency components of the composite phase error signal to produce the control voltage for the VCO.

The PLL circuit according to the first aspect of the present invention has the following function on the basis of the above-mentioned configuration. That is, in a first stage of the PLL controlling operation, the drawing operation of the VCO is started on the basis of the digital phase error signal having a large detected signal voltage. After the completion of the drawing operation, the operation of suppressing the noise is started on the basis of the analog phase error signal having a high error detecting accuracy.

Therefore, there is provided the effect that an extremely accurate phase controlling operation is performed by the analog phase detection loop, and at the same time, the C/N ratio of the VCO can be improved.

A PLL circuit according to a second aspect of the present invention includes: a VCO for generating an output signal having a frequency which is variable in accordance with a control voltage; first frequency-dividing means for frequency-dividing the output signal supplied from the VCO to produce a first digital feedback signal; second frequency-dividing means for frequency-dividing the first digital feedback signal to produce a second digital feedback signal; reference signal generating means for generating both an analog reference signal and a digital reference signal each having a reference frequency; frequency-multiplying means for frequency-multiplying the analog reference signal to produce the frequency-multiplied analog reference signal; first phase error detecting means for comparing a phase of the second digital feedback signal with a phase of the digital reference signal to obtain a first signal representing a phase error therebetween and integrating the first phase error signal; second phase error detecting means for comparing the phase of the second digital feedback signal with a phase of the analog reference signal to obtain a second signal representing a phase error therebetween, and for adding the second phase error signal to the integrated first phase error signal and extracting low frequency components from the added signal to obtain a composite phase error signal; and third phase error detecting means for comparing a phase of the first digital feedback signal with a phase of the frequency-multiplied analog reference signal to obtain a third phase error signal representing a phase error therebetween, and for adding the third phase error signal to the composite phase error signal and extracting low frequency components from the added signal to produce the control voltage for the VCO.

The PLL circuit according to the second aspect of the present invention has the following function on the basis of the above-mentioned configuration. That is, in a first stage of the PLL control, since the output level of each of the phase error signals which are obtained from the second and third phase error detecting means is very small, the drawing operation of the VCO is started on the basis of the first phase error signal obtained from the first phase error detecting means. When the lock voltage has been determined by the drawing operation, the frequency of the output signal supplied from the VCO is first led to the frequency band in the vicinity of the desired frequency. Thereafter, since both the output sensitivity and the accuracy of the second phase error signal, which is obtained from the second phase error detecting means, become higher than those of the first phase error signal, which is obtained from the first phase error detecting means, and therefore, the PLL controlling operation is performed on the basis of the first composite phase error signal supplied from the second phase error detecting means.

Further, thereafter, in the case where the locking state is maintained on the basis of the first composite phase error signal and the sensitivity of detecting the phase error between the associated signals is intended to further increase under this condition, the PLL controlling operation is performed on the basis of the third phase error signal with a high comparison frequency in which the sensitivity of detecting the phase error between the associated signals and the detection accuracy are higher.

Therefore, the PLL controlling operation can be performed in which the merits of the digital phase detection are utilized during the drawing operation of the VCO, and after the completion of the drawing operation, the merits of the extremely accurate analog phase detection are utilized. In addition, there is provided the effect that the extremely accurate phase controlling operation can be performed by the third phase error detecting means for detecting the phase error at higher comparison frequency than that of the reference signal, and thus the C/N ratio of the VCO can be sufficiently improved.

A multi-channel FM receiving method for receiving a multi-channel FM input signal respective channels of which have center frequencies located at intervals of a predetermined frequency and within a first frequency band, according to a third aspect of the present invention, includes the steps of: producing a first local oscillation signal which has a variable frequency at a plurality of integral multiples of the predetermined frequency and within a second frequency band which does not overlap with the first frequency band; receiving the first local oscillation signal to up-convert the FM input signal, thereby producing a first intermediate frequency signal having a frequency which is different from the frequencies corresponding to two times the center frequencies of the channels of the FM input signal and which does not overlap with the first and second frequency bands; producing a second local oscillation signal having a fixed frequency which does not overlap with said first and second frequency bands and a frequency band of the first intermediate frequency signal; and receiving the second local oscillation signal to down-convert the first intermediate frequency signal, thereby producing a second intermediate frequency signal.

A multi-channel FM receiving apparatus for receiving a multi-channel FM input signal, respective channels of which have center frequencies located at intervals of a predetermined frequency and within a first frequency band, according to the present invention, includes: first local oscillation signal producing means for producing a first local oscillation signal which has a variable frequency at a plurality of integral multiples of the predetermined frequency and within a second frequency band which does not overlap with the first frequency band; first intermediate frequency signal producing means for receiving the first local oscillation signal to up-convert the FM input signal, thereby producing a first intermediate frequency signal having a frequency which is different from the frequencies corresponding to two times the center frequencies of the channels of the FM input signal and which does not overlap with the first and second frequency bands; second local oscillation signal producing means for producing a second local oscillation signal having a fixed frequency which does not overlap with the first and second frequency bands and a frequency band of the first intermediate frequency signal; and second intermediate frequency signal producing means for receiving the second local oscillation signal to down-convert the first intermediate frequency signal, thereby producing a second intermediate frequency signal.

In the multi-channel FM receiving method and apparatus, according to the present invention, having the above-mentioned configuration, the frequencies are set in such a way that the frequency band of the multi-channel FM input signal in which the central frequencies of respective channels are located at intervals of the predetermined frequency, the frequency band of the first local oscillation signal, the frequency band of the first intermediate frequency signal, and the frequency band of the second local oscillation signal do not overlap with one another at all, and the reference frequency of the PLL of the first local oscillation signal producing means can be increased up to the theoretical limit. Therefore, the performance of suppressing the noise in the broad-band micro-wave band oscillator, which has been considered to be difficult in a technical aspect, can be made good as much as possible, and as a result, it is possible to reduce the measurable noise of the image base band signal after the detection.

BRIEF DESCRIPTION OF THE DRAWINGS

FIGS. 10A to 10C are respectively views each showing the frequency spectrum of a multi-channel FM signal in the embodiment of the present invention;

FIG. 11 is a functional block diagram showing a configuration of a general PLL circuit having a single loop;

FIG. 12A is a waveform chart of a comparison frequency signal and a control voltage signal in the case where a comparison frequency is high in the PLL circuit shown in FIG. 11;

FIG. 12B is a waveform chart of the comparison frequency signal and the control voltage signal in the case where the comparison frequency is low in the PLL circuit shown in FIG. 11;

DESCRIPTION OF THE PREFERRED EMBODIMENTS

The preferred embodiments of a PLL circuit of the present invention will hereinafter be described with reference to the accompanying drawings.

Figure 4:
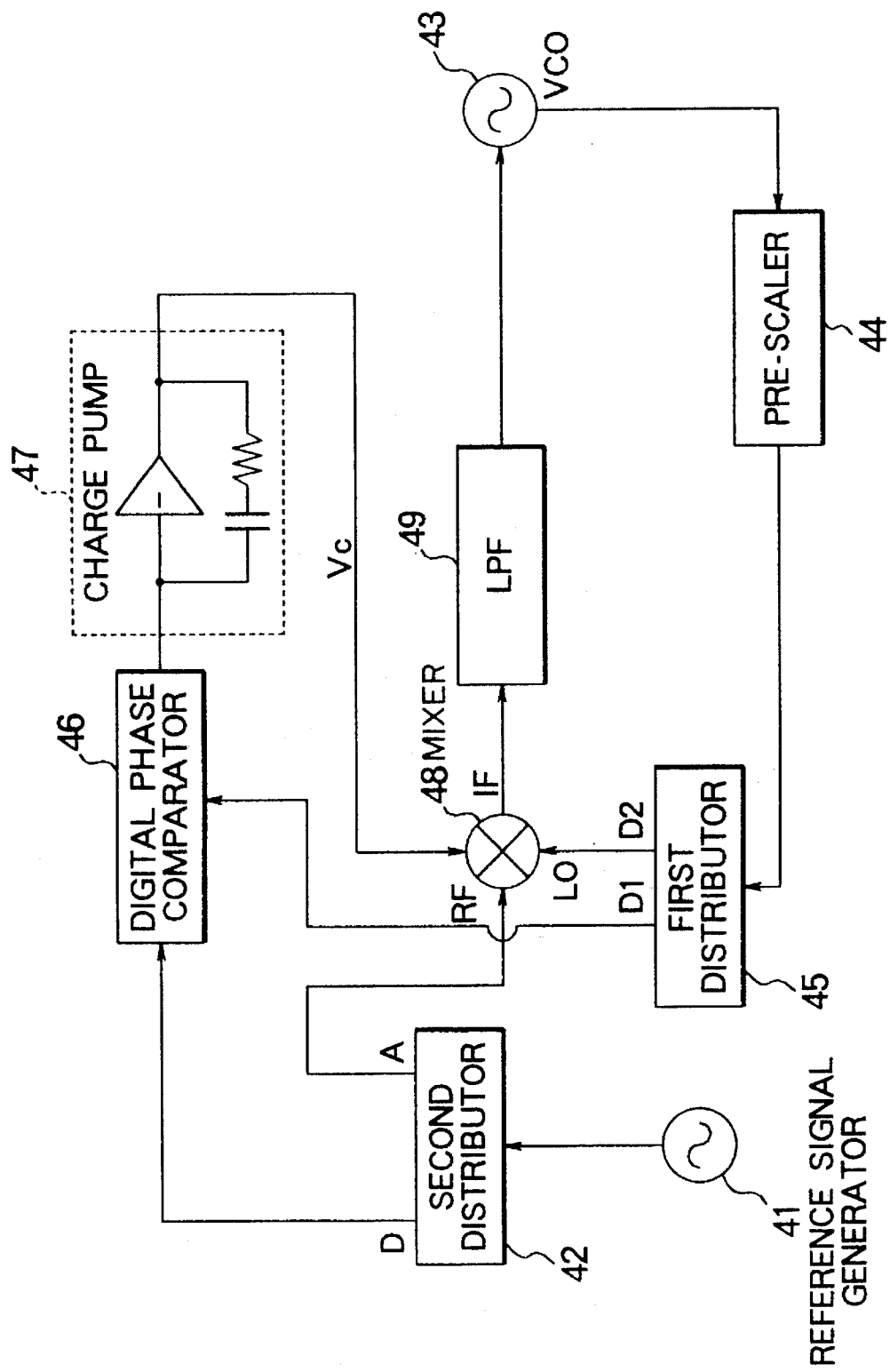
FIG. 4 is a functional block diagram showing a configuration of a first embodiment of a PLL circuit of the present invention.

FIG. 4 is a functional block diagram showing a configuration of a first embodiment of the PLL circuit of the present invention. In FIG. 4, the reference numeral 41 designates a reference signal generator which operates to generate a reference signal, and the reference numeral 42 designates a distributor which operates to distribute the reference signal input thereto. The distributor 42 has the function of outputting a digital reference signal (a square wave) from an output D and outputting an analog reference signal (a sine wave) from an output A. The reference numeral 43 designates a VCO an oscillation frequency of which is changed in accordance with a tuning voltage as the supplied DC voltage, and the reference numeral 44 designates a pre-scaler which operates to frequency-divide an output oscillation signal, which has been supplied from the VCO 43, in the form of a feedback signal. The reference numeral 45 designates a distributor which operates to divide the feedback signal which has been obtained by the frequency-dividing in the pre-scaler 44 to output a first digital feedback signal from an output D1 and to output a second digital feedback signal from an output D2.

The reference numeral 46 designates a digital phase comparator which operates to detect a difference in phase between the digital reference signal supplied from the distributor 42 and the first digital feedback signal supplied from the distributor 45 to output a digital signal representing a phase error therebetween. The reference numeral 47 designates a charge pump which operates to eliminate the carrier component of the digital phase error signal to output a DC voltage Vc. Digital phase error detecting means is constituted by the digital phase comparator 46 and the charge pump 47. In addition, the reference numeral 48 designates a mixer which is isolated in a DC aspect from other units. To an RF port of the mixer 48, the analog reference signal is supplied from the distributor 42, and to an LO port thereof, the second digital feedback signal is supplied from the distributor 45. Further, to an earthing terminal which is normally grounded, the DC voltage Vc from the charge pump 47, i.e., the digital phase error signal is supplied. The reference numeral 49 designates a low-pass filter which operates to eliminate the high frequency components and the noise component from the output signal supplied from the mixer 48. An output signal of the low-pass filter 49 is supplied to the VCO 43 to be used as the tuning voltage.

Figures 5A, 5B:
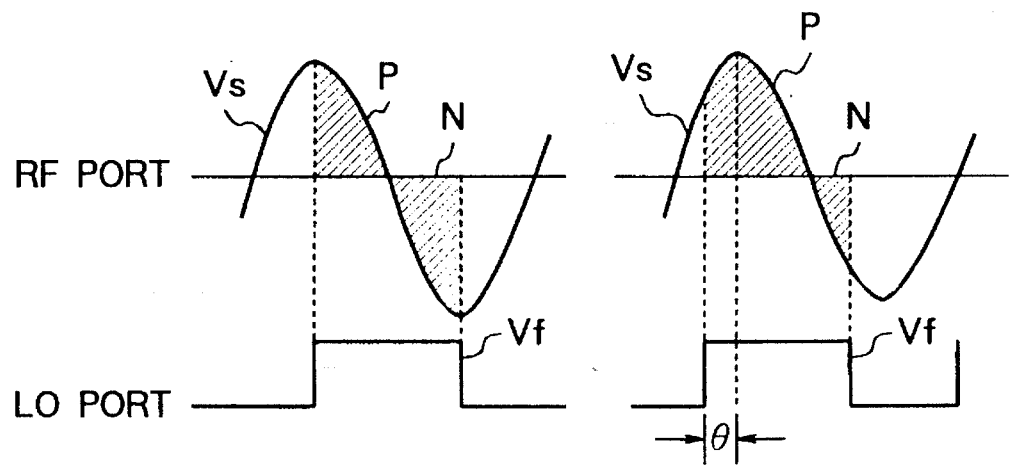
FIG. 5A is a signal waveform chart showing the relationship between a signal at an RF port and a signal at an LO port in the PLL circuit shown in FIG. 4 in the case where they are in phase with each other.
FIG. 5B is a signal waveform chart showing the relationship between the phase of the signal at the RF port and the phase of the signal at the LO port in the PLL circuit shown in FIG. 4 in the case where they are shifted from each other.

Next, a description will hereinbelow be given with respect to the operation of the PLL circuit having the configuration shown in FIG. 4. FIGS. 5A and 5B are respectively signal waveform charts each showing the phase relationship between the analog reference signal Vs and the second digital feedback signal Vf which are supplied to the RF port and the LO port of the mixer 48, respectively.

In this connection, FIG. 5A shows the state in which the analog reference signal Vs is in phase with the second digital feedback signal Vf. In this case, the timing of the positive maximum value of the analog reference signal Vs coincides with the leading timing of the second digital feedback signal Vf, and the timing of the negative maximum value of the analog reference signal Vs coincides with the trailing timing of the second digital feedback signal Vf. Therefore, with respect to the analog reference signal Vs for a period of time when the second digital feedback signal Vf is at the high level, the area of the positive part P is, as shown by the hatching of the figure, equal to the area of the negative part N. As a result, the integral value for this period of time is zero.

FIG. 5B shows the state in which the phase of the analog reference signal Vs is shifted from the phase of the second digital feedback signal Vf by θ. In this case, with respect to the analog reference signal Vs for a period of time when the pulse of the second digital feedback signal Vf is at the high level, the area of the positive part P is, as shown by the hatching of the figure, larger than that of the negative part N. As a result, the integral value with respect to that period of time takes a positive value. That is, that integral value (the value including the sign) is changed in accordance with the quantity of phase shift. Therefore, the output signal from the IF port of the mixer 48 is integrated by the low-pass filter 49, whereby the tuning voltage as the analog phase error signal which is changed in accordance with the phase error is supplied to the VCO 43.

Figure 2:
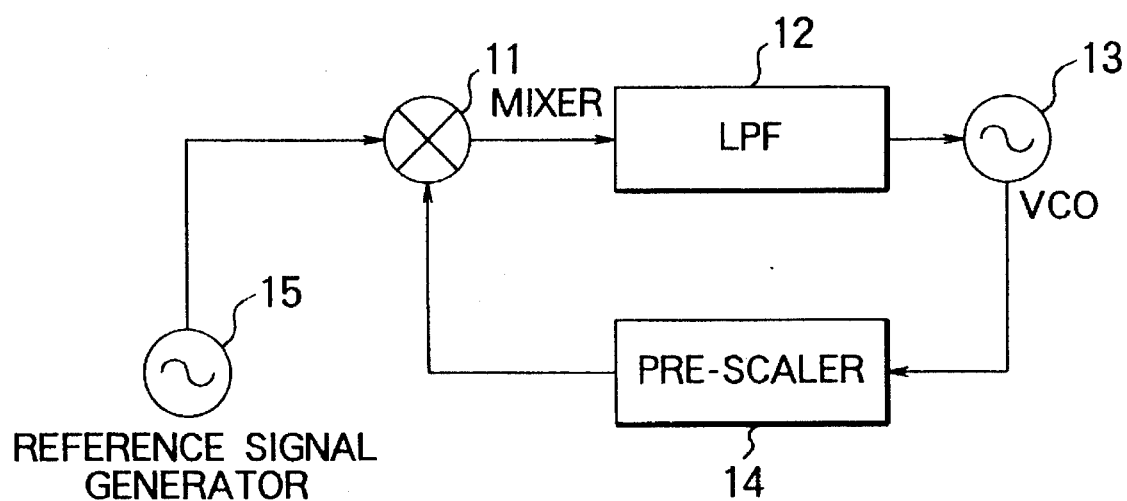
FIG. 2 is a functional block diagram showing a configuration of the conventional analog PLL circuit.
Figure 3:
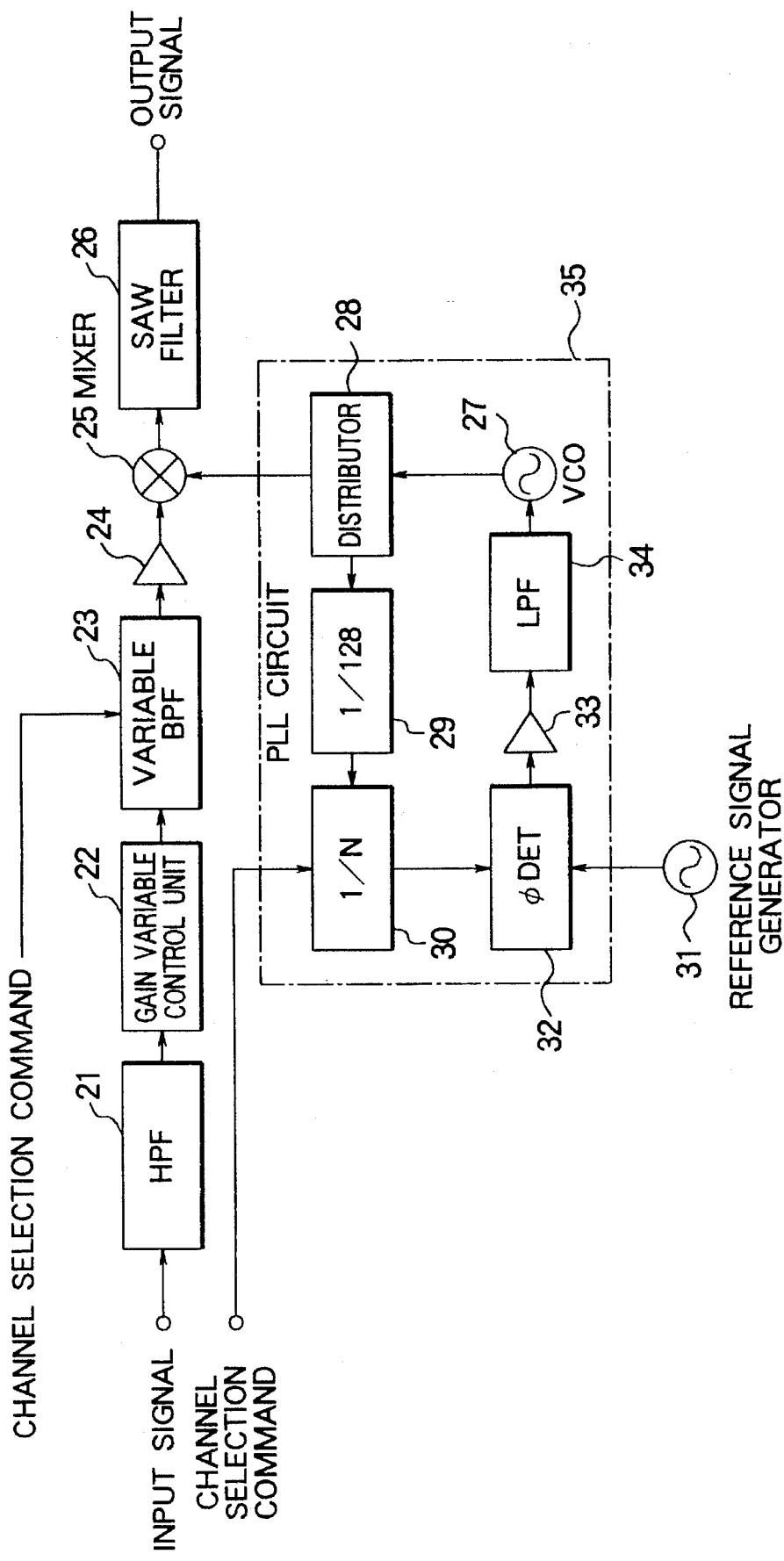
FIG. 3 is a functional block diagram showing a configuration of an apparatus to which the conventional multi-channel FM receiving method is applied.
Figure 6A:
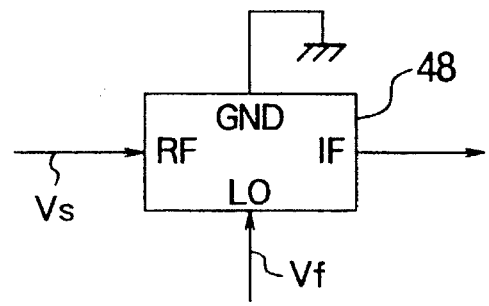
FIG. 6A is a diagram showing a configuration in the case where a mixer is used in accordance with the conventional method.
Figure 6B:
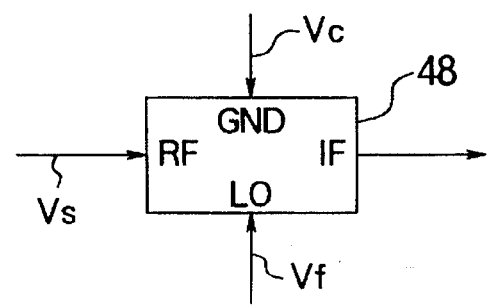
FIG. 6B is a diagram showing a configuration in the case where a mixer is used in accordance with a method of the present invention.

FIG. 6A is a diagram showing the method of utilizing the conventional mixer shown in FIG. 2. In the figure, the GND terminal of the mixer is grounded. FIG. 6B is a diagram showing the signals which are supplied to the mixer 48 which is applied to the present invention. In the figure, to the GND terminal, the DC phase error signal Vc which has been output from the charge pump 47 is supplied. Therefore, the composite phase error signal in which the digital phase error signal is superimposed on the analog phase error signal is supplied to the VCO 43.

In this way, double feedback loops made up of the analog system and the digital system are formed in the PLL circuit, thereby composing the analog phase error signal and the digital phase error signal, and the resultant composite phase error signal is utilized as the tuning voltage for the VCO. As a result, a good C/N ratio can be obtained on the basis of the analog phase error signal, and also the broad-band locking operation can be performed on the basis of the digital phase error signal.

The important points of the present embodiment are, in the illustrated configuration, (1) that the mixer 48 having the IF port, which is isolated in a DC aspect from both the RF port and the LO port, is used as the analog phase comparator, (2) and that since there is no need for amplifying the detected voltage, any active device becomes unnecessary and thus the disturbance noise is suppressed except for the switching noise of the mixer 48 and (3) the lock phase of the digital phase comparator 46 is made variable so that the RF phase and the LO phase of the mixer 48 have the relationship as shown in FIG. 5A, in which the detection sensitivity of the mixer 48 becomes maximum, on the completion of the PLL operation.

Figure 7A:
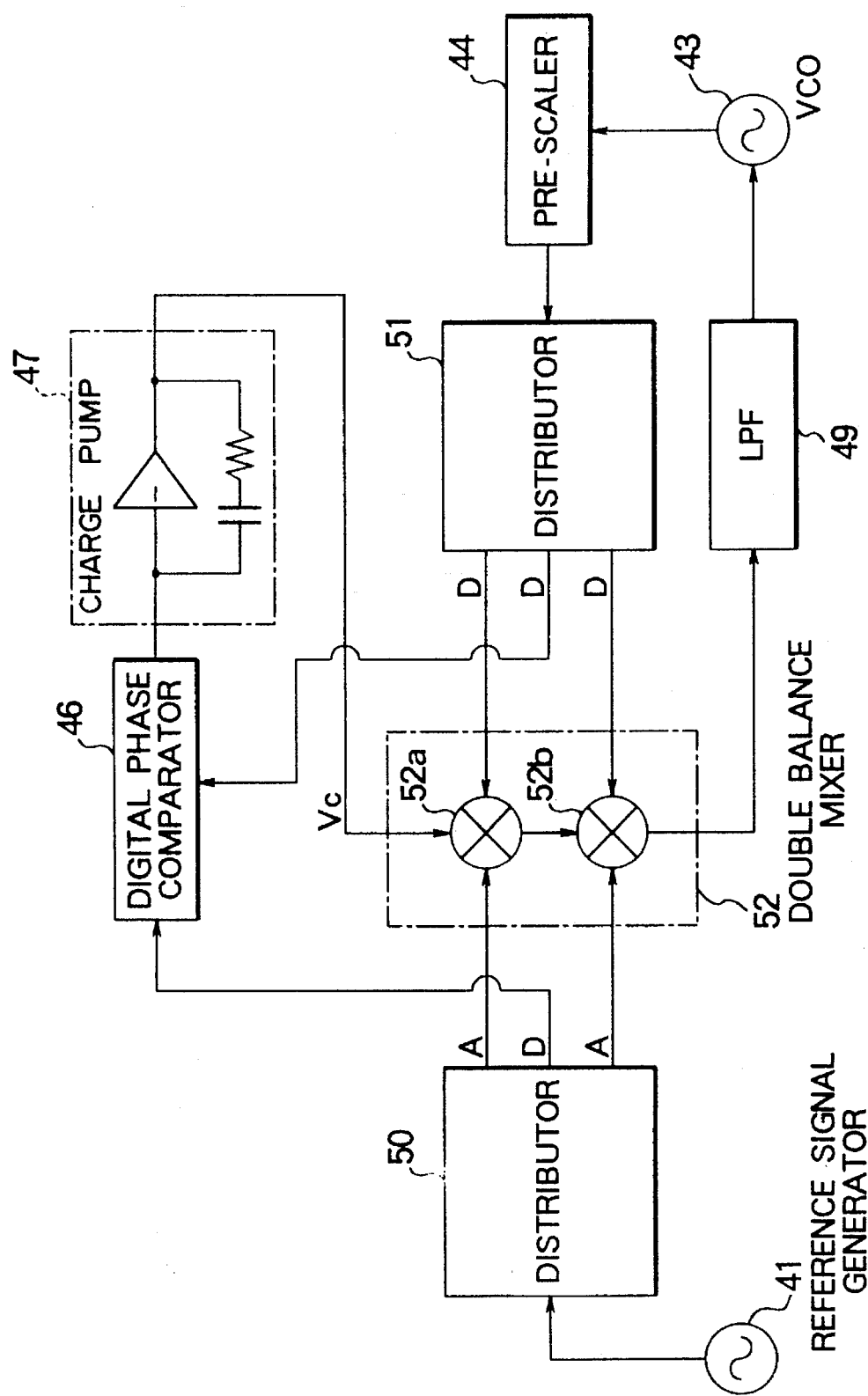
FIG. 7A is a functional block diagram showing a configuration of a second embodiment of the PLL circuit of the present invention.

FIG. 7A is a functional block diagram showing a configuration of a second embodiment of the PLL circuit of the present invention. In the configuration of the second embodiment of the present invention, units similar to those of the first embodiment previously described with reference to FIG. 4 are designated by the same reference numerals, and the description thereof will not be discussed here for the sake of simplicity.

In FIG. 7A, the reference numeral 50 designates a distributor which operates to distribute the reference signal supplied from the reference signal generator 41 into two analog reference signals and one digital reference signal. The reference numeral 51 designates a distributor which operates to distribute the signal which has been obtained by the dividing in the pre-scaler 44 into first, second and third digital reference signals. The reference numeral 52 designates a two-stage double balance mixer which is isolated in a DC aspect. The reference numeral 52a designates a first mixer which operates to multiply a first analog reference signal output from the distributor 50 by the second digital feedback signal output from the distributor 51 to obtain a first analog signal representing a phase error therebetween and to add the digital phase error signal obtained from the charge pump 47 to the first analog phase error signal to output a first composite phase error signal. The reference numeral 52b designates a second mixer which operates to multiply a second analog reference signal output from the distributor 50 by a third digital feedback signal output from the distributor 51 to obtain a second analog phase error signal representing a phase error therebetween and to add the first composite phase error signal to the second analog phase error signal to output a second composite phase error signal.

Figure 7B:
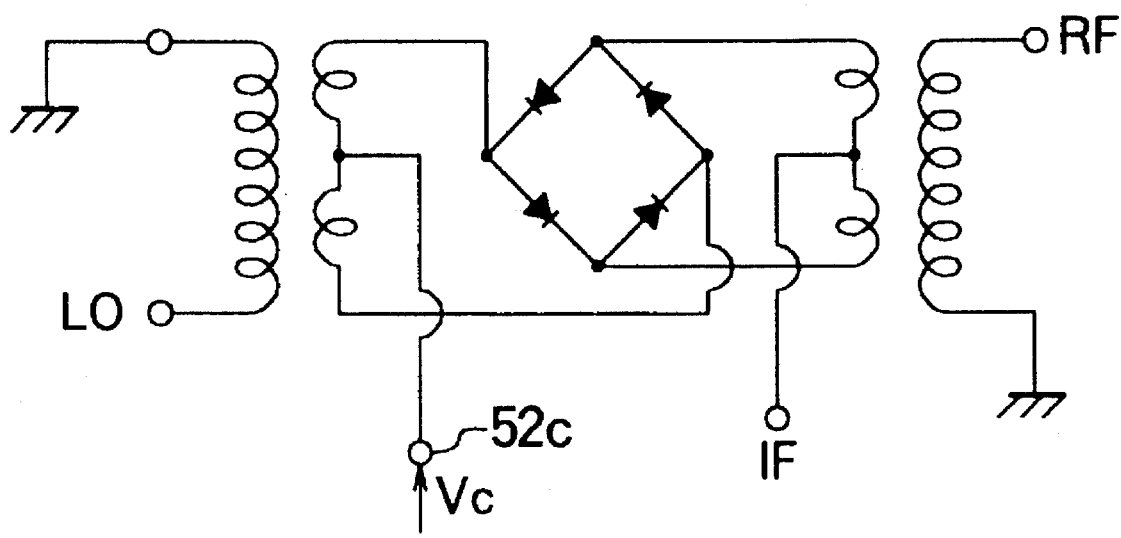
FIG. 7B is a circuit diagram showing a configuration of a mixer in the PLL circuit shown in FIG. 7A.

FIG. 7B shows a circuit configuration of the first mixer 52a shown in FIG. 7A. In this connection, to the prior art GND terminal 52c, the digital phase error signal Vc is supplied.

The feature of the second embodiment is that the mixer 52 is configured by the two-stages. In order to reduce the switching noise of the mixer 52 down to the limit to further promote the C/N ratio suppression, it is necessary to decrease the levels of both the RF and LO signals which are to be added to the mixer, and as a result, the detection sensitivity is necessarily decreased. For the purpose of compensating for this decreasing of the detection sensitivity, the mixer of interest is configured by the two stages.

The PLL circuit of the present invention is, as apparent from the above-mentioned embodiment, designed in such a way that the demerits of the digital phase comparison type PLL compensates for those of the analog phase comparison type PLL. Thus, there is provided the effect that a good C/N ratio can be obtained and also the broad-band locking operation can be performed. In addition, there is also provided the effect that the noise having a frequency near the oscillation spectrum, which is generated in the free run operation by the VCO, can be effectively reduced.

Next, a description will hereinbelow be given with respect to a third embodiment of the PLL circuit of the present invention.

Figure 8:
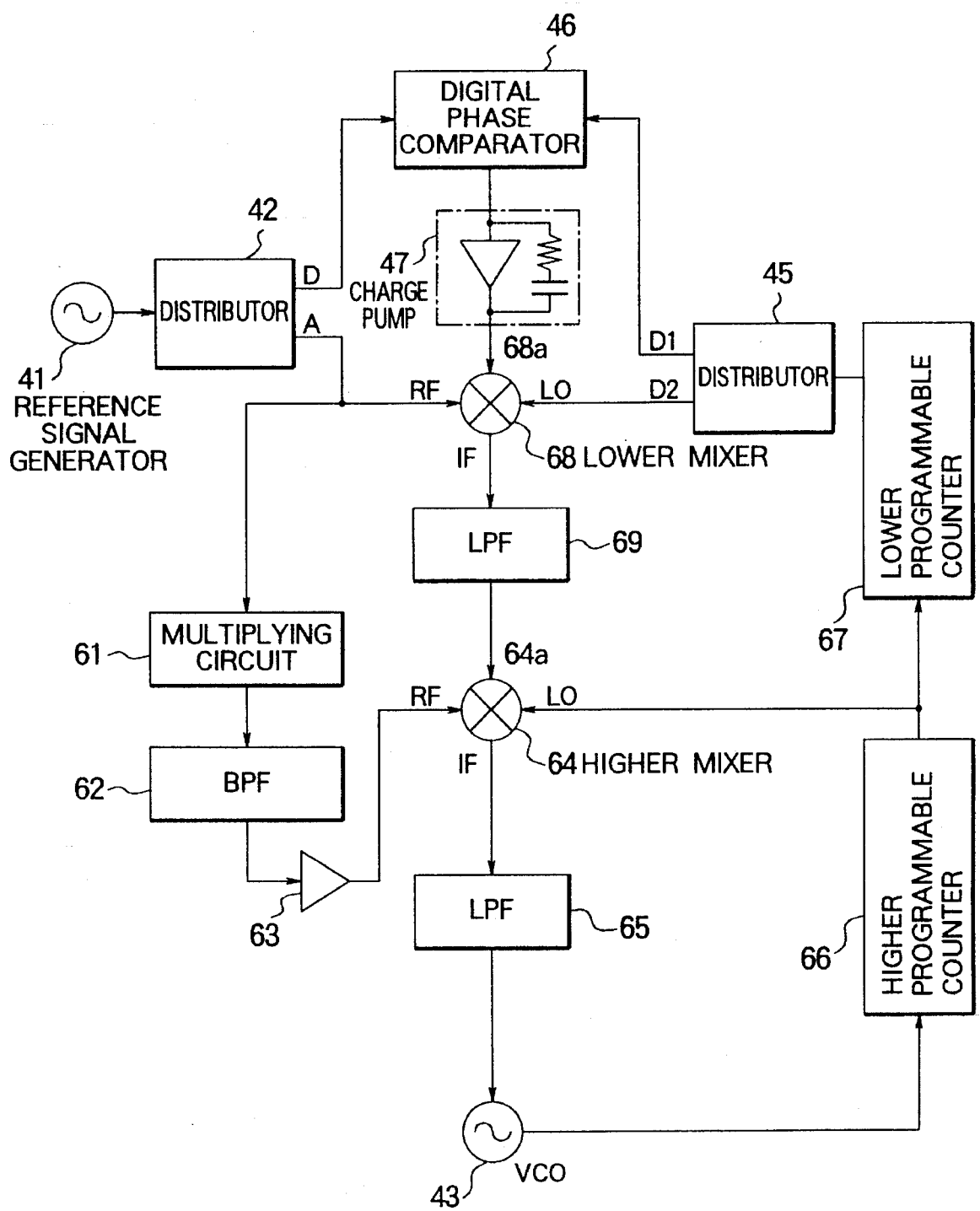
FIG. 8 is a functional block diagram showing a configuration of a third embodiment of the PLL circuit of the present invention.

FIG. 8 is a functional block diagram showing a configuration of a third embodiment of the PLL circuit of the present invention. In FIG. 8, the reference numeral 41 designates a reference signal generator which operates to generates a reference signal, and the reference numeral 42 designates a distributor which operates to distribute this reference signal. In this connection, the distributor 42 has the function of outputting a digital reference signal (a square wave) from an output D and outputting an analog reference signal (a sine wave) from an output A. Further, the reference numeral 43 designates a VCO an oscillation frequency of which is changed in accordance with the tuning voltage as the supplied DC control voltage, and the reference numeral 66 designates a higher programmable counter as the first frequency-dividing means which operates to frequency-divide an output oscillation signal, which has been supplied from the VCO 23 to produce a first digital feedback signal having a higher frequency than that of the reference signal. The reference numeral 67 designates a lower programmable counter as the second frequency-dividing means which operates to further frequency-divide the first digital feedback signal, which has been obtained by the frequency-dividing in the higher programmable counter 66, to produce a second digital feedback signal having a lower frequency than that of the first digital feedback signal. The reference numeral 45 designates a distributor which operates to divide the second digital feedback signal which has been output from the lower programmable counter 67 to output the resultant digital signals.

Further, the reference numeral 46 designates a digital phase comparator which operates to detect a difference in phase between the digital reference signal supplied from the distributor 42 and the digital feedback signal supplied from the distributor 45 to output a digital signal representing a phase error therebetween. The reference numeral 47 designates a charge pump which operates to amplify and smooth the digital phase error signal to eliminate the carrier component thereof, thereby outputting a DC voltage. First phase error detecting means is constituted by the digital phase comparator 46 and the charge pump 47.

The reference numeral 68 designates a lower mixer which is isolated in a DC aspect. To an RF port of the lower mixer

68, the analog reference signal output from the distributor 42 is supplied, and to an LO port thereof, the second digital feedback signal output from the distributor 45 is supplied. In addition, to a terminal 68a which is normally grounded, the DC signal supplied from the charge pump 47, i.e., the digital phase error signal is supplied. Therefore, from an IF port, as the output port, of the lower mixer 68, a first composite phase error signal is output in which the digital phase error signal is superimposed on the phase error signal which represents the difference in phase between the analog reference signal and the second digital feedback signal. The reference numeral 69 designates a low-pass filter which operates to eliminate both the high frequency components and the noise components from the first composite phase error signal which has been supplied from the lower mixer 68. Second phase error detecting means is constituted by the lower mixer 68 and the low-pass filter 69.

The reference numeral 61 designates a frequency-multiplying circuit which operates to convert the analog reference signal obtained from the distributor 42 into a high frequency analog reference signal which includes the component having the same frequency as that of the output signal of the higher programmable counter 66. The reference numeral 62 designates a band-pass filter which operates to pass the component having the same frequency as that of the output signal of the higher programmable counter 66. By the provision of this band-pass filter 62, the output signal of the frequency-multiplying circuit 61 is limited to the spectrum including the desired lock frequencies. The reference numeral 63 designates an amplifier which operates to amplify the high frequency analog reference signal, which has been output from the band-pass filter 62, to a predetermined level.

The reference numeral 64 designates a higher mixer which is isolated in a DC aspect in a similar manner to that in the lower mixer 68. In this connection, to an RF port of the higher mixer 64, the high frequency analog reference signal which has been amplified to the predetermined level by the amplifier 63, and to an LO port thereof, the first digital feedback signal supplied from the higher programmable counter 66, i.e., the high frequency digital feedback signal is supplied. In addition, to a terminal 64a which is normally grounded, the first composite phase error signal which has been output from the low-pass filter 69 is supplied.

Therefore, from an IF port as the output port of the mixer 64, a second composite phase error signal is output in which the first composite phase error signal is superimposed on the phase error signal which represents the difference in phase between the high frequency analog reference signal and the second digital feedback signal. The reference numeral 65 designates a low-pass filter which operates to eliminate both the high frequency components and the noise component from the second composite phase error signal input thereto. The second composite phase error signal which has been output from the low-pass filter 65 is fed back as the tuning voltage to the VCO 43. Third phase error detecting means is constituted by the higher mixer 64 and the low-pass filter 65.

In this way, according to the present embodiment, triple loops are constituted by the digital phase-comparison control loop as the first loop provided by the first phase error detecting means, the lower phase-comparison-mixer control loop as the second loop provided by the second phase error detecting means, and the higher phase-comparison-mixer control loop as the third loop provided by the third phase error detecting means.

Next, a description will hereinbelow be given with respect to the operation of the PLL circuit of the above-mentioned embodiment.

In a first stage of the PLL controlling operation, since the output level of each of the phase error signals which are respectively obtained from the mixer 68 and the mixer 64 is very small, the drawing operation of the VCO is started on the basis of the phase error signal obtained from the charge pump 47. When the lock voltage has been determined to some degree by this drawing operation, the frequency of the output signal of the VCO 43 is first led to the frequency band near the desired frequency. Thereafter, since the output level of the phase error signal which has been obtained from the mixer 68 becomes higher than the level of the phase error signal which has been supplied from the charge pump 47, the PLL controlling operation is performed on the basis of the first composite phase error signal supplied from the low-pass filter 69.

Thereafter, the lock state is maintained on the basis of the first composite phase error signal. Then, in the case where the sensitivity of detecting the phase error is intended to further increase, the PLL controlling operation is performed on the basis of the second phase error signal having the higher reference frequency in which both the sensitivity of detecting the phase error and the detection accuracy further increase.

In this case, in order to prevent the hunting operation of each loop, it is necessary to provide a difference for the detection sensitivity, or to provide a difference among the cut-off frequencies of the filters 47, 69 and 65 which are connected to the output ports of the loops, respectively.

For example, it is preferable that (1) the gain of the charge pump 47 is set to a large value and the response thereof is set to be very slow, (2) the response of the low-pass filter 69 is set to be slightly more quick than that of the charge pump 47 and the detection sensitivity thereof is set to a large value, and (3) in the low-pass filter 65, the cut-off frequency is extended up to a maximum value where the sideband drops and instead thereof, the detection sensitivity is decreased.

Next, the operation will hereinbelow be described from a viewpoint of the frequency spectrum by giving an example.

It is assumed that the oscillation frequency band of the VCO 43 is in the range of 4.4 GHz to 6.4 GHz, i.e., 2 GHz. In addition, it is assumed that the dividing ratio of the higher programmable counter 66 is set to 1/8, the dividing ratio of the lower programmable counter 67 is set to the range of 1/167 to 1/117, and the reference frequency of the reference signal generator 41 is set to 4.795 MHz. Then, the operation is as follows.

The digital phase comparison control loop as the first loop and the lower phase comparison mixer control loop as the second loop are operated with the comparison frequency of 4.795 MHz. In the case where the dividing ratio of the lower programmable counter is 1/117, since the dividing ratio of the higher programmable counter is 1/8, the lock frequency of the VCO 43 is determined on the basis of the following expression:

4.795 MHz×117×8=4.48812 GHz.

In addition, the comparison frequency of the higher mixer 64 at that time is expressed by the following expression:

4.48812 GHz/8=561.015 MHz

In this case, among the harmonics in the spectrum which are generated by the frequency-multiplying circuit 61 and which have the frequency intervals of 4.795 MHz, the 117th harmonic frequency will be utilized.

If a filter constant of the low-pass filter 65 is set so as to pass, out of the second composite phase error signal output from the IF port of the higher mixer 64, only the DC voltage in the completion of the lock and to prevent the high frequency signals having the frequencies which are integral multiples of 4.795 MHz, then any component in the spectrum other than the desired harmonic frequency will be ignored.

As is apparent from the above-mentioned embodiment, according to the PLL circuit of the present invention, there is provided the effect that by adopting the configuration of the triple detection loops, the demerits of the digital phase comparison type PLL and the demerits of the analog phase comparison type PLL compensate for each other, and the compensation frequency is increased without the channel space of the desired lock frequency being provided roughly, whereby the detection sensitivity can be increased. In addition, there is also provided the effect that noise having a frequency near the oscillation frequency, which the VCO generates in the free run, can be effectively reduced.

Next, a description will hereinbelow be given with respect to the preferred embodiments of the FM receiving method and apparatus according to the present invention with reference to the accompanying drawings.

Figure 9:
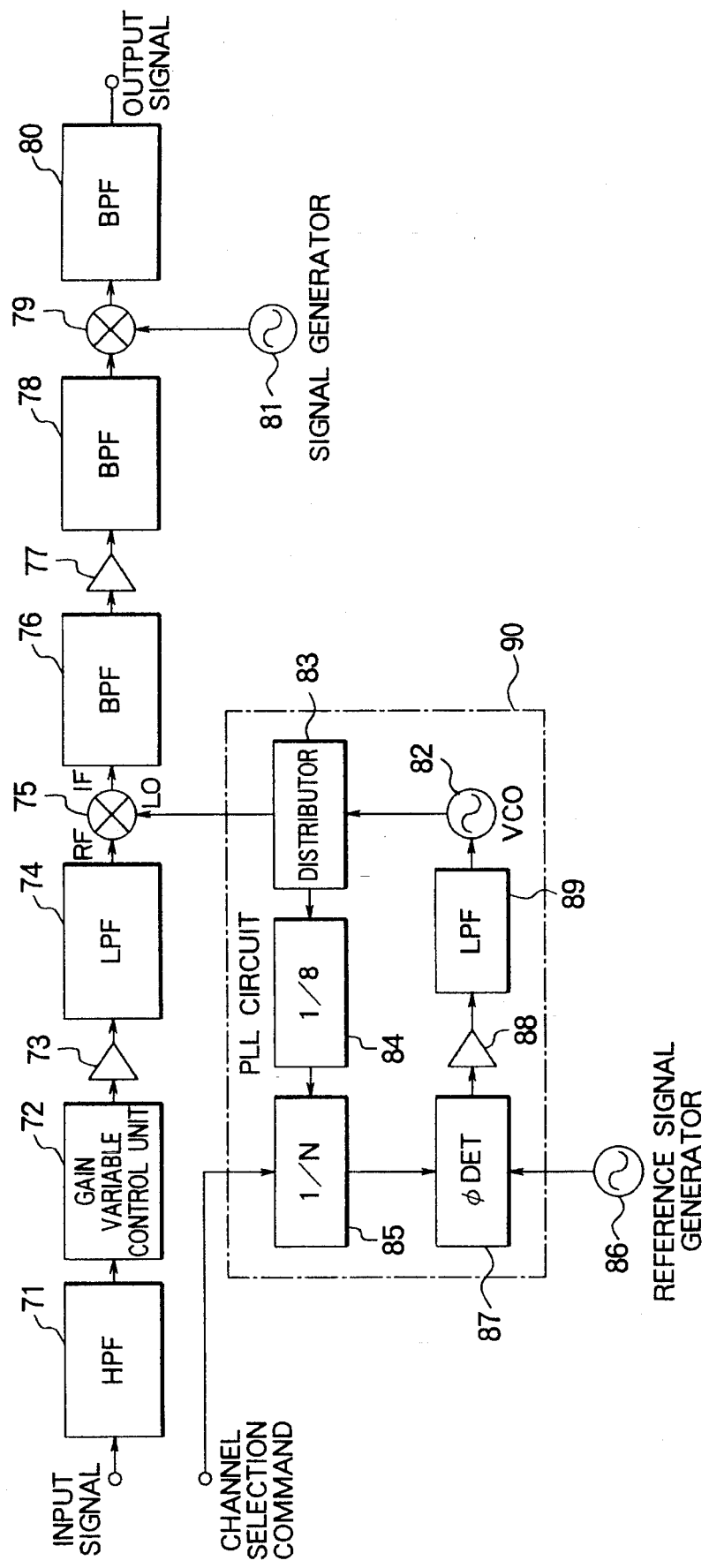
FIG. 9 is a functional block diagram showing a configuration of a multi-channel FM receiver in an embodiment of the present invention.

FIG. 9 is a functional block diagram showing a configuration of a multi-channel FM receiver in an embodiment of the present invention. In FIG. 9, the reference numeral 71 designates a high-pass filter which operates to eliminate the unnecessary components of the low frequency band from a received signal to select a multi-channel FM signal. The reference numeral 72 designates a gain variable control unit which operates to adjust the multi-channel FM signal which has been obtained from the high-pass filter 71 to a predetermined level. The reference numeral 73 designates a broad-band amplifier which operates to amplify the FM signal which has been obtained from the gain variable control unit 72. The reference numeral 74 designates a low-pass filter which operates to eliminate the unnecessary high frequency components of the amplified FM signal. The reference numeral 75 designates an up-converting mixer (hereinafter, referred to as "a first mixer" for short, when applicable) as the first intermediate frequency signal producing means which operates to receive a first local oscillation signal to up-convert the FM signal obtained from the low-pass filter 74, thereby producing a first intermediate frequency signal.

The reference numeral 76 designates a band-pass filter which is, for example, composed of a half-wave-length type filter or a dielectric filter or the like and operates to eliminate the unnecessary components from the intermediate frequency signal which has been obtained from the first mixer 75. The reference numeral 77 designates a narrow-band amplifier which operates to amplify the first intermediate frequency signal which has been passed through the band-pass filter 76. The reference numeral 78 designates a band-pass filter which is, for example, composed of a half-wave-length type filter or a dielectric filter or the like and operates to eliminate the unnecessary components from the first intermediate frequency signal amplified by the amplifier 77. The reference numeral 79 designates a down-converting mixer (hereinafter, referred to as "a second mixer" for short, when applicable) as the second intermediate frequency signal producing means which operates to receive a second station sent signal to down-convert the first intermediate frequency signal which has been passed through the band-pass filter 78, thereby producing a second an intermediate frequency signal. The reference numeral 80 designates a band-pass filter which operates to eliminate the unnecessary components from the second intermediate frequency signal.

The reference numeral 81 designates a signal generator which operates to produce the second local oscillation signal and to supply it to the second mixer 79.

The reference numeral 82 designates a VCO an oscillation frequency of an output signal of which is changed in accordance with the DC control signal supplied thereto. The reference numeral 83 designates a distributor which operates to divide the output signal which has been supplied from the VCO 82 into the first local oscillation signal which is to be supplied to the first mixer 75 and the feedback signal which is used to produce the DC control signal. The reference numeral 84 designates a pre-scaler which operates to divide the feedback signal which has been obtained from the distributor 83 by one-eighth. The reference numeral 85 designates a programmable pre-scaler (hereinafter, referred to as "a second divider" for short, when applicable) which operates to further divide the feedback signal, which has been obtained by the dividing in the pre-scaler 84, by 1/N (N is an integral number from 107 to 192 and changes in accordance with the channel selection signal) on the basis of the channel selection command issued from a controller (in particular, not shown).

Further, the reference numeral 86 designates a reference signal generator which operates to produce a reference signal. The reference numeral 87 designates a phase error detecting circuit (hereinafter, referred to as "a phase comparator" for short, when applicable) which operates to detect a phase error occurring between the feedback signal obtained from the programmable pre-scaler 85 and the reference signal obtained from the reference signal generator 86 to produce a signal representing a phase error therebetween. The reference numeral 88 designates an amplifier which operates to amplify the phase error signal input thereto, and the reference numeral 89 designates a low-pass filter which operates to extract the DC component of the phase error signal to supply the DC component as the DC control signal to the VCO 82. That is, the loop circuit extending from the VCO 82 up to the low-pass filter 89 constitutes a PLL circuit 90.

This PLL circuit 90 may be realized by the PLL circuit having a double loop structure, or a PLL circuit having a triple loop structure which is used to obtain the first local oscillation signal having low phase noise as the feature of the present system. Those various PLL circuits will be described later.

Next, a description will hereinbelow be given with respect to the operation of the FM receiver having the configuration shown in FIG. 9. FIGS. 10A to 10C are respectively views each showing the frequency spectrum of the multi-channel FM signal in the present embodiment. FIGS. 10A and 10B are respectively views each showing the multi-channel FM signal as the input signal. As shown in FIG. 10A, in this input signal, the central frequencies of the channels are located at intervals of a predetermined frequency of 38.36 MHz. In addition, as shown in FIG. 10B, the total number of channels of the multi-channel FM input signal is 86, and the central frequencies of the 86 channels from f(1)= 128.84 MHz to f(86)=3389.44 MHz are located at intervals of the predetermined frequency of 38.36 MHz (hereinafter, this frequency arrangement is referred to as the channel plan).

With respect to the above-mentioned multi-channel FM signal, after the unnecessary signal, the frequency of which is equal to or lower than 100 MHz, has been eliminated and then the amplitude difference is absorbed in the gain variable control unit 72, the resultant multi-channel FM signal is amplified by the broad-band amplifier 73. In addition, the unnecessary components such as the high frequency band noises are eliminated by the low-pass filter 74, and then the resultant FM signal is supplied to the RF port of the first mixer 75. To the LO port of the first mixer 75, the first local oscillation signal corresponding to the 86 channels from $f_{LO1}(1)=4104.52$ MHz to $f_{LO1}(86)=7365.12$ MHz which are located at intervals of the predetermined frequency of 38.36 MHz, is supplied through both the VCO 82 and the distributor 83.

In the first mixer 75, the input signal which has been supplied from the RF port is up-converted on the basis of the first local oscillation signal at the LO port to produce the first intermediate frequency signal having the central frequency of $f_{IF1}=3975.68$ MHz. The frequency spectrum distribution is shown in FIG. 10C. As to the significance which this intermediate frequency of 3975.68 MHz has, there are the following two features.

One of the advantages is such that the second harmonic component of the input signal supplied from the RF port which is generated in the first mixer 75 is prevented from occurring in the frequency band of the first intermediate frequency. That is, the frequency of 1987.84 MHz which is a half the frequency of 3975.68 MHz and which exerts a maximum influence on the carrier having the central frequency of 3975.68 MHz is given by:

$$1987.84 \text{ MHz}=128.84 \text{ MHz}+38.36 \text{ MHz}\times 48.46$$

Then, the energy of this frequency component is approximately the middle between f(49) and f(50) of the channel plan shown in FIG. 10B, and therefore, it is set in such a way that the interference becomes minimum.

Another advantage is that the frequency fLO1 of the first local oscillation signal, which is used to produce the signal having that intermediate frequency, is an integral multiple of 38.36 MHz. The reason thereof is as follows.

The frequency of the first local oscillation signal, which is to be supplied to the first mixer 75, is supplied from the VCO 82, and the oscillation frequency range of the VCO 82 is in the range of 4.1 GHz to 7.4 GHz which does not exceed the octave. However, from a viewpoint of the phase noise of the oscillation spectrum, the influence of the phase noise in the free run of the VCO 82 can not be ignored.

Therefore, since there occurs the necessity of utilizing the C/N ratio suppressing effect by the PLL circuit 90 effectively as much as possible, it is preferable that the comparison frequency in the PLL circuit 90 is increased sufficiently as much as possible. On the other hand, the channel space is 38.36 MHz and the feedback signal to be divided has an ultra high frequency. Therefore, the first-stage pre-scaler 84 for frequency-dividing the output signal supplied from the VCO 82 must be the fixed pre-scaler. Accordingly, the possible maximum comparison frequency in the present stage is limited to the frequency of 4.795 MHz which is one-eighth the frequency of 38.36 MHz. As a result, the frequency $f_{LO1}$ of the first local oscillation signal which can be locked by this frequency becomes an integral multiple of 38.36 MHz, and thus it is convenient to specify the first intermediate frequency $f_{IF1}$ to be 3975.68 MHz.

For example, assuming that the desired signal is the input signal of the eleventh channel having the frequency f(11)= 512.44 MHz, the frequency of the first local oscillation signal is expressed by the following expression and thus it is an multiple of 38.36 MHz:

$$\begin{aligned} 512.44 \text{ MHz} + 3975.68 \text{ MHz} &= 4488.12 \text{ MHz} \\ &= 117 \times 38.36 \text{ MHz} \end{aligned}$$

After the first intermediate frequency signal which has been output from the first mixer 75 is passed through the band-pass filter 76, the narrow-band amplifier 77 and the band-pass filter 78, it is down-converted to a signal having a frequency of 402.78 MHz as the second intermediate frequency by the second mixer 79. Then, the interference among the adjacent channels is prevented by the band-pass filter 80 and the resultant signal is detected by a detection circuit (in particular, not shown). Incidentally, with respect to the signal generator 81, the oscillation signal thereof has the fixed frequency. Therefore, the signal generator can be composed of a DRO oscillator which is relatively excellent in phase noise performance.

In the present embodiment, as the PLL circuit 90, a PLL circuit, which has the double loops as shown in FIG. 4 or 7A, can be applied. In general, in the case where the phase detector detects digitally the phase, the phase detector is readily influenced by the disturbance noise such as the ripple of the power source voltage and thus the C/N ratio of the original phase information becomes poor as the detection sensitivity of the phase comparator is higher. In this respect, in the case of the analog phase detection, a better C/N ratio can be obtained. On the other hand, in the case of the analog phase detection, since the PLL circuit can be constituted by only the passive devices, the C/N ratio can be improved. However, there is a disadvantage that the output level of the phase information is decreased.

Therefore, the double feedback loops made up of the analog system and the digital system are formed in the PLL circuit so that the analog phase error signal and the digital phase error signal are composed and the resultant composite signal is utilized as the tuning voltage for the VCO, whereby a good C/N ratio can be obtained on the basis of the analog phase error signal and also the broad-band locking operation can be performed on the basis of the digital phase error signal.

Further, in the present embodiment, as the PLL circuit 90, a PLL circuit, which has the triple loops as shown in FIG. 8, can be applied. This PLL circuit includes, but is not limited to, the triple loops, i.e., the digital phase-comparison control loop as the first loop provided by the first phase error detecting means, the lower phase-comparison-mixer control loop as the second loop provided by the second phase error detecting means, and the higher phase-comparison-mixer control loop as the third loop provided by the third phase error detecting means.

Next, the reason that the structure of the triple loops is adopted will hereinbelow be described in detail.

FIG. 11 is a functional block diagram showing a configuration of the PLL circuit having the general single loop. The output signal which has been output from a VCO 27 is divided by 1/N in a divider 30 to be input to a phase comparator 32. On the other hand, the reference signal which has been supplied from a reference signal generator 31 is also input to the phase comparator 32 and then a signal representing a phase error therebetween is output to be amplified by an amplifier 33. Then, the signal component having the comparison frequency is eliminated through a low-pass filter 34 and then the resultant control signal as the DC component is fed back to the VCO 27. Therefore, ideally, there is no problem in the configuration having the single loop shown in FIG. 11.

However, actually, this PLL circuit having the single loop encounters the various problems. For example, not only is processing performed in which only the phase noise component in the free run which is contained in the output signal of the VCO 27 is directly divided by 1/N on the frequency axis and the divided phase noise component is input to the phase comparator 32, but also in the case where the value N is large, the jitter of the counter of the divider 30 is added. Therefore, this results in the information of the true phase error signal being lost. As a result, it is better as the range of N is smaller.

FIGS. 12A and 12B are respectively a waveform chart showing the state in the case where the comparison frequency is higher, and a waveform chart showing the state in the case where the comparison frequency is lower. In those figures, the reference numeral 91 designates a waveform of the component having the comparison frequency, and the reference numeral 92 designates a waveform of the control voltage signal which is fed back to the VCO 27. In addition, in those figures, the reference symbol tc designates a control timing, and the reference symbol td designates a detection timing. As can be seen from those figures, if the comparison frequency is increased in the phase comparator 32, the control can be performed finely in a time aspect. If the value of N is increased, the comparison frequency will be decreased. Therefore, in this respect as well, it is better that the value of N is smaller.

However, on the other hand, in the case of the multi-channel FM receiving operation, as shown in FIGS. 10A to 10C, from a viewpoint of the channel space (38.36 MHz in this case), the upper limit of the comparison frequency is necessarily present. Thus, simply decreasing the value of N and also increasing the comparison frequency give rise to result in a new problem.

Figure 1:
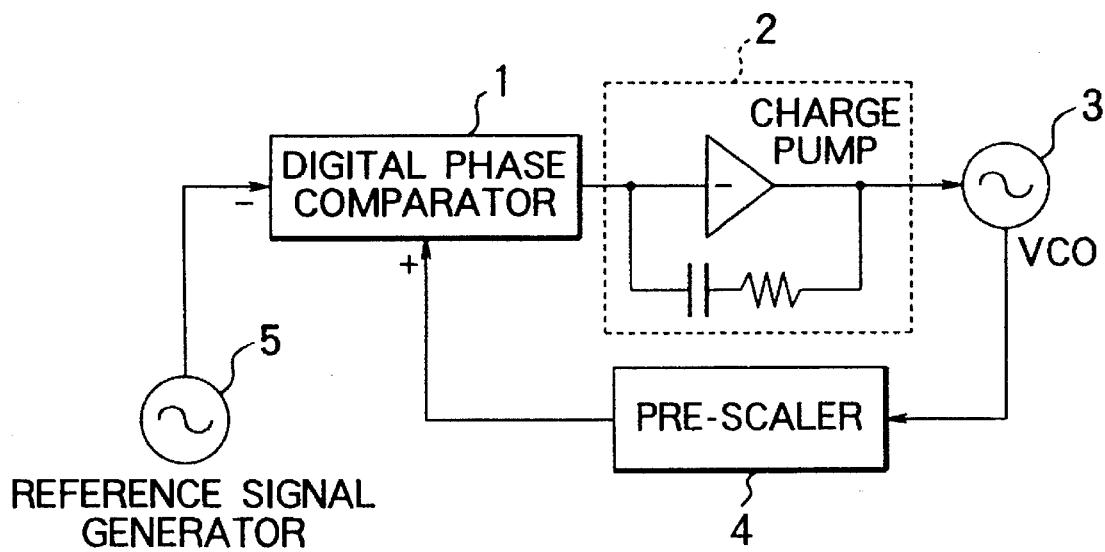
FIG. 1 is a functional block diagram showing a configuration of the conventional digital PLL circuit.
Figure 13A:
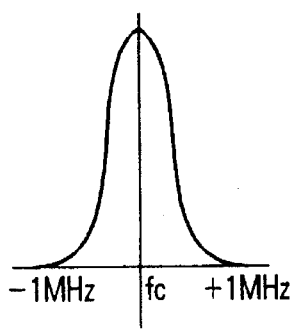
FIG. 13A is a view showing the frequency band characteristics of a phase error signal in the free run of the VCO in the PLL circuit shown in FIG. 11.
Figure 13B:
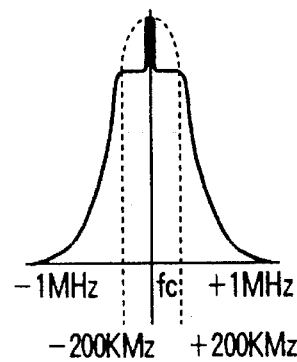
FIG. 13B is a view showing the phase error signal characteristics in the case where a cut-off frequency of a low-pass filter is 200 kHz in the PLL circuit shown in FIG. 11.
Figure 13C:
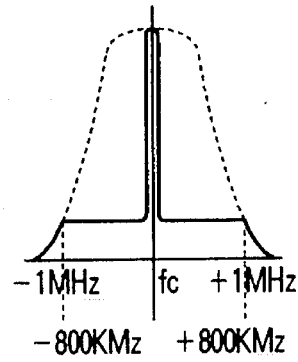
FIG. 13C is a view showing the phase error signal characteristics in the case where a cut-off frequency of a low-pass filter is 800 kHz in the PLL circuit shown in FIG. 11.

Further, the cut-off frequency of the low-pass filter 34 is normally, from the necessity of decreasing sufficiently the comparison frequency, about 1/10 to about 1/100 times as low as the comparison frequency. As a result, the response of the control voltage signal which is fed back to the VCO 27 becomes poor. For example, in the case where the frequency band characteristics of the phase noise component in the free run of the VCO 27 shows, as illustrated in FIG. 13A, 1 MHz, the improvement state of the phase component is changed depending on the characteristics of the low-pass filter 34. In this connection, FIG. 13B shows the phase noise component in the case where the cut-off frequency of the low-pass filter 34 is 200 kHz, and FIG. 13C shows the phase noise component in the case where the cut-off frequency of the low-pass filter 34 is 800 kHz.

Therefore, in the case where the phase noise component in the free run of the VCO 27 has the broad-band and the frequency spectrum distribution thereof is wide, there arises the problem that sufficient control can not be performed by only the single loop.

Accordingly, the triple loop structure is adopted in which in addition to the digital phase detection loop, the two phase detection loops having different frequency characteristics from each other are provided, whereby the above-mentioned series of problems can be solved.

That is, in a first stage of the PLL controlling operation, since the output level of each of the phase error signals which are obtained from the lower mixer 68 and the higher mixer 64 in FIG. 8 is very small, the drawing operation of the VCO is started on the basis of the phase error signal obtained from the charge pump 47. When the lock voltage has been determined by the drawing operation, the output frequency of the output signal supplied from the VCO 43 is first led to the frequency band which is located in the vicinity of the desired frequency. Therefore, in order to perform the fine control, the PLL controlling operation is performed on the basis of the first composite phase error signal. At the same time, the PLL controlling operation is performed on the basis of the second composite phase error signal which is different in frequency spectrum from the first composite phase error signal.

Figure 14:
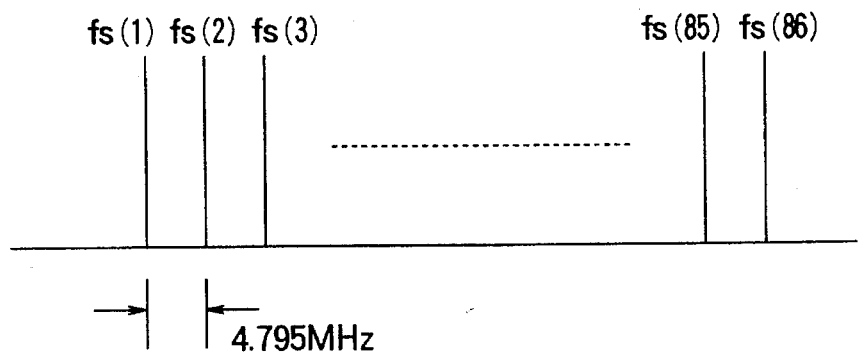
FIG. 14 is a view showing the arrangement of the harmonic signals which are output from the frequency-multiplier and extracted through a band-pass filter in the case where the PLL circuit shown in FIG. 8 is employed in the multi-channel FM receiver of the embodiment of the present invention.

In this case, the frequency-multiplier 61 generates the higher harmonic signals, the frequencies of which are integral multiples of 4.795 MHz. FIG. 14 is a view showing the arrangement of the frequencies of the harmonic signals $f_s(1)$ to $f_s(86)$ which are extracted by the band-pass filter 62. In addition, the higher harmonic signal $f_s(1)$ (its frequency is 513.065 MHz) up to $f_s(86)$ (its frequency is 920.64 MHz) as shown in FIG. 14 are amplified by the amplifier 63 to be supplied to the higher mixer 64. As a result, the higher mixer 64 operates in such a way that the channel 1 is locked to the higher harmonic signal $f_s(1)$ and the channel 86 is locked to the higher harmonic signal $f_s(86)$. Therefore, the control can be finely performed in a time aspect, and the cut-off frequency of the low-pass filter 65 can be increased. But, after the completion of the locking operation, the higher harmonic wave having a frequency of 4.795 MHz is contained in the tuning voltage as the control voltage signal. Therefore, it is necessary to provide the low-pass filter 65 with the cut-off characteristics for eliminating the sideband, the frequency of which is an integral multiple of 4.795 MHz.

With respect to the present multi-channel FM receiving method, in the case where another one of the other PLL circuits is used therein, the frequency relationship for achieving excellent C/N ratio characteristics is always established, and thus it constitutes a very effective multi-channel FM receiving method.

As is apparent from the above-mentioned description, the FM receiving method and apparatus of the present invention are such that the multi-channel FM input signal on the basis of the channel plan according to the present BS format, in which, for example, the 86 channels from 128.84 MHz up to 3389.44 MHz are located at intervals of 38.36 MHz, can be selectively received without the problems of image disturbance and local leakage. Therefore, there is provided the effect that a broad-band system can be constructed in which the interference occurring between the second intermediate frequency and any one wave (for example, its frequency is 397.36 MHz) of the input signal is eliminated, and the frequencies of all the fundamental waves to be managed can be present having differences from each other in the range of, for example, 128.84 MHz to 7365.12 MHz.

We claim:

1. A PLL circuit comprising:

a VCO for generating an output signal having a frequency which is variable in accordance with a control voltage;

a pre-scaler for frequency-dividing the output signal sent from said VCO to obtain a digital feedback signal;

reference signal generating means for generating both an analog reference signal and a digital reference signal each having a reference frequency;

digital phase error detecting means for comparing the digital reference signal with the digital feedback signal to obtain a digital phase error signal representing a phase error therebetween and for integrating the digital phase error signal;

analog phase error detecting means for comparing the analog reference signal with the digital feedback signal to obtain an analog phase error signal representing a phase error therebetween;

first adding means for adding the analog phase error signal to the integrated digital phase error signal to obtain a composite phase error signal;

a low-pass filter for eliminating high frequency components of the composite phase error signal to produce the control voltage for said VCO;

second analog phase error detecting means for comparing the analog reference signal with the digital feedback signal to produce a second analog phase error signal representing a phase error therebetween; and second adding means for adding the second analog phase error signal to the composite error signal.

2. A PLL circuit according to claim 1, wherein said adding means supplies the digital phase error signal to an output side earthing terminal of said analog phase error detecting means.

3. A PLL circuit comprising:

a VCO for generating an output signal having a frequency which is variable in accordance with a control voltage;

first frequency-dividing means for frequency-dividing the output signal sent from said VCO to produce a first digital feedback signal;

second frequency-dividing means for frequency-dividing the first digital feedback signal to produce a second digital feedback signal;

reference signal generating means for generating both an analog reference signal and a digital reference signal each having a reference frequency;

frequency-multiplying means for frequency-multiplying the analog reference signal to produce the frequency-multiplied analog reference signal;

first phase error detecting means for comparing a phase of the second digital feedback signal with a phase of the digital reference signal to obtain a first phase error signal representing a phase error there-between and integrating the first phase error signal;

second phase error detecting means for comparing the phase of the second digital feedback signal with a phase of the analog reference signal to obtain a second phase error signal representing a phase error therebetween, and for adding the second phase error signal to the integrated first phase error signal and extracting the low frequency components from the added signal to obtain a composite phase error signal; and third phase error detecting means for comparing a phase of the first digital feedback signal with a phase of the frequency-multiplied analog reference signal to obtain a third phase error signal representing a phase error therebetween, and for adding the third phase error signal to the composite phase error signal and extracting the low frequency components from the added signal to produce the control voltage for said VCO.

4. A multi-channel FM receiving apparatus for receiving a multi-channel FM input signal having respective channels with center frequencies located at intervals of a predetermined frequency and within a first frequency band, said apparatus comprising:

first local oscillation signal producing means for producing a first local oscillation signal which has a variable frequency at a plurality of integral multiples of the predetermined frequency and within a second frequency band which does not overlap with said first frequency band;

first intermediate frequency signal producing means for receiving the first local oscillation signal to up-convert the FM input signal, thereby producing a first intermediate frequency signal having a frequency which is different from the frequencies corresponding to two times the center frequencies of the channels of the FM input signal and which does not overlap with said first and second frequency bands;

second local oscillation signal producing means for producing a second local oscillation signal having a fixed frequency which does not overlap with said first and second frequency bands and a frequency band of the first intermediate frequency signal; and second intermediate frequency signal producing means for receiving the second local oscillation signal to down-convert the first intermediate frequency signal, thereby producing a second intermediate frequency signal; and, wherein said first local oscillation signal producing means includes a PLL circuit comprising:

a VCO for generating an output signal having a frequency which is variable in accordance with a control voltage;

first frequency-dividing means for frequency-dividing the output signal sent from said VCO to produce a first digital feedback signal;

second frequency-dividing means for frequency-dividing the first digital feedback signal to produce a second digital feedback signal;

reference signal generating means for generating both an analog reference signal and a digital reference signal each having a reference frequency;

frequency-multiplying means for frequency-multiplying the analog reference signal to produce the frequency-multiplied analog reference signal;

first phase error detecting means for comparing a phase of the second digital feedback signal with a phase of the digital reference signal to obtain a first phase error signal representing a phase error therebetween and integrating the first phase error signal;

second phase error detecting means for comparing the phase of the second digital feedback signal with a phase of the analog reference signal to obtain a second phase error signal representing a phase error therebetween, and for adding the second phase error signal to the integrated first phase error signal and extracting the low frequency components from the added signal to obtain a composite phase error signal; and third phase error detecting means for comparing a phase of the first digital feedback signal with a phase of the frequency-multiplied analog reference signal to obtain a third phase error signal representing a phase error therebetween, and for adding the third phase error signal to the composite phase error signal and extracting the low frequency components from the added signal to produce the control voltage for said VCO.

* * * * *